April 9, 1968 N. E. ANDERSSON ET AL 3,377,523

SEMICONDUCTOR DEVICE COOLED FROM ONE SIDE

Filed Sept. 9, 1965 2 Sheets-Sheet 1

INVENTORS
Nils Eric Andersson
Göran Lilja
BY
Bailey, Stephens & Huettig
Attorneys

SEMICONDUCTOR DEVICE COOLED FROM ONE SIDE

Filed Sept. 9, 1965 2 Sheets-Sheet 2

INVENTORS
Nils Eric Andersson
Göran Lilja
BY
Bailey, Stephens + Huettig
Attorneys United States Patent Office 3,377,523

Patented Apr. 9, 1968

3,377,523
SEMICONDUCTOR DEVICE COOLED FROM ONE SIDE

Nils Eric Andersson and Göran Lilja, Ludvika, Sweden assignors to Allmänna Svenska Elektriska Aktiebolaget, Vasteras, Sweden, a corporation of Sweden Filed Sept. 9, 1965, Ser. No. 486,080
Claims priority, application Sweden, Sept. 28, 1964, 11,583/64
2 Claims. (Cl. 317—234)

Figure 1:
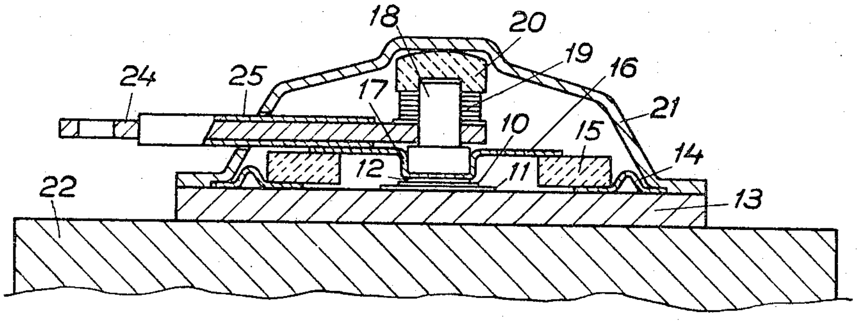

Semiconductor devices for large current strengths usually comprise a semiconductor system with a semiconductor disc of silicon or germanium, which on both sides is surrounded by support plates of a material with about the same coefficient of thermal expansion as the semiconducting material, fixed to the semiconductor disc by soldering or the like. The support plates usually consist of molybdenum, tungsten, fernico or similar iron-nickel-cobalt or iron-nickel alloys. The support plates are usually considerably thicker than the semiconductor disc. In known embodiments of such semiconductor devices with cooling from one side, the semiconductor system at the one support plate is arranged on a base member of a material with good heat conducting properties, for example copper, which is in contact with a cooling body, and at the other support plate arranged in pressure contact with a counter electrode effected by a compressing device, the semiconductor system as well as the compressing device being arranged in a hermetically sealed casing which besides the said base member comprises a cover above the base member and joined to the base member. This cover consists of a metallic part situated nearest to the base member and of another metallic part situated above the semiconductor system and of an intermediate part of insulating material situated between the metallic parts.

According to the present invention, on the contrary, the counter electrode and the compressing device are arranged outside the hermetically sealed casing.

The present invention thus relates to a semiconductor device cooled from one side, for example a transistor, a thyristor or a crystal diode for high currents, in which a semiconductor system having surfaces which are substantially perpendicular to the current direction of the semiconductor device is hermetically enclosed in a casing comprising a base member of metallic material arranged in heat conducting contact with a cooling body or serving as a cooling body itself for the semiconductor system and a cover arranged above the base member and joined to the base member and having a metallic part nearest to the base member and another metallic part above the semiconductor system and an intermediate part of insulating material between and insulating the metallic parts from each other, and in which semiconductor device a counter electrode is arranged in pressure contact with the semiconductor system by means of a compressing device. The semiconductor according to the invention is characterised by the fact that the counter electrode and the compressing device are arranged in a cap arranged on the outside of the cover, the compressing device being clamped between the counter electrode and the cap. The cap is preferably fixed to the base member or the cooling body.

An important advantage of the semiconductor device according to the invention is that the encasing of the semiconductor system in the hermetically sealed casing can be done in a process separate from that in which the counter electrode and the compressing device are mounted. Through this fact the great demands for maintaining extreme cleanliness during the encasing of the semiconductor system can more easily be complied with. After completing the said delicate process, the assemblage of the counter electrode and the compressing device can be carried out under normal workshop conditions. Another important advantage is that repairs and the replacing of parts is to a great extent facilitated. For example, a damaged counter electrode or damaged compressing device can be replaced without it being necessary to replace the complete semiconductor device or to open and reclose a hermetically sealed casing. In the same way a damaged semiconductor system can be replaced by only this and its surounding hermetically sealed casing being replaced without such a change concerning the counter electrode and the compressing device.

By the expression high currents is meant current strengths of the size of 10 amperes and above.

The semiconductor system can consist of a semiconductor disc of, for example, silicon or germanium, which on one or both sides is provided with thin metal layers applied on the semiconductor disc, for example by deposition from vapour, cathode sputtering or by electrolytic deposition. The metal layers may be applied in connection with the doping of the semiconductor disc or in a separate process afterwards. As examples of metals in the layers the following can be mentioned: gold, silver, copper, aluminium, nickel, lead and alloys containing one of these metals. The semi-conductor system can among other things also consist of a semiconductor disc which on one or both sides is provided with support plates of molybdenum, tungsten, fernico or another material with substantially the same coefficient of thermal expansion as the semiconductor disc. Such support plates can be fixed to the semiconductor disc in a conventional way. It is also possible to completely exclude the use of metal layers and support plates on the sides of the semiconductor disc. The semiconductor system is then constituted only of the semiconductor disc. In this last mentioned case it is suitable to use semiconductor discs with highly doped surface layers.

The invention will be explained in more detail by the description of a number of embodiments with reference to the accompanying drawing, in which FIG. 1 is a section through a semiconductor device according to the invention in its current direction, FIG. 2 the same semiconductor device seen from above, FIG. 3 a section through another semiconductor device according to the invention in its current direction and FIG. 4 the semiconductor device according to FIG. 3 see from above.

The diodes shown in the figures are intended for a current of for example 150 amperes. A round silicon disc 10 of p-n-p$^+$-type is soldered on the underside with an aluminium layer not shown to a support plate 11 of molybdenum or another material with approximately the same coefficient of thermal expansion as silicon and on the upper side is provided with an alloyed gold-antimony contact in the form of a layer 12. The semiconductor system consisting of the elements 10, 11 and 12 is hermetically enclosed in a casing, which comprises a base member 13, of, for example, copper, aluminium, silumin or another metallic material with good heat conducting properties and a cover consisting of the round parts 14, 15 and 16. The parts 14 and 16 can consist of, for example, copper, molybdenum, tungsten, iron-nickel alloy or iron-nickel-cobalt alloy and the part 15 of, for example ceramic or porcelain. During the assemblage of the casing the parts 14 and 16 are fixed first to the ring 15, for example by hard soldering with silver solder. The cover so produced from the parts 14, 15 and 16 is then placed above the base member 13 with the semiconductor system previously arranged in place, after which the casing is hermetically sealed at the periphery of the part 14. If the sealing is carried out by cold press welding, the parts 13 and 14 must of course consist of a material which can be cold press welded, for example, copper. If the sealing is carried out, for example, by soldering the parts can consist of any of the above mentioned materials. Towards the outside of the cover in the cylindrical indentation 17 the counter electrode 18 is situated, which is pressed towards the cover by spring washers 19. These are supported over a cylindrical body 20 of insulating material, for example ceramic, by the cap 21 acting as a support in the form of a domed press washer, for example of steel. As is evident from FIG. 2, the cap 21 and the base member 13 are fixed to the cooling body 22 by screws 23. The connection conductor 24 is connected to the counter electrode. This conductor is brought through the cap 21 and insulated from it with an insulating covering 25, for example of glass fibre tape. In the case shown in FIG. 1 the pressure contact between the semiconductor system and the counter electrode is effected by the compressing device consisting of the spring washers 19 being clamped when the cap is fixed to the cooling body.

Figure 2:
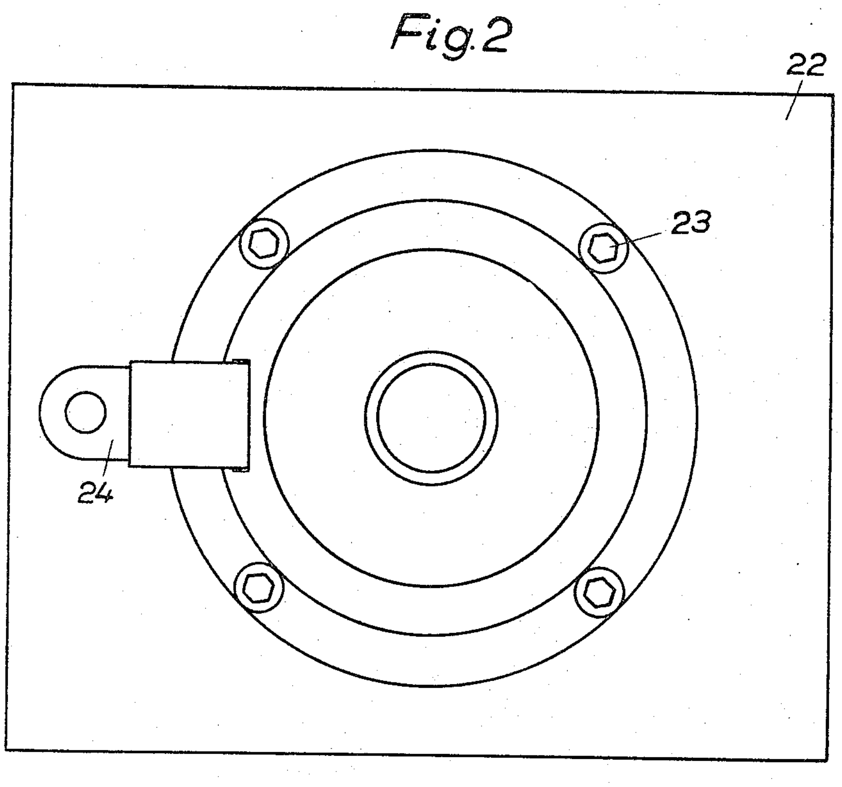
Figure 3:
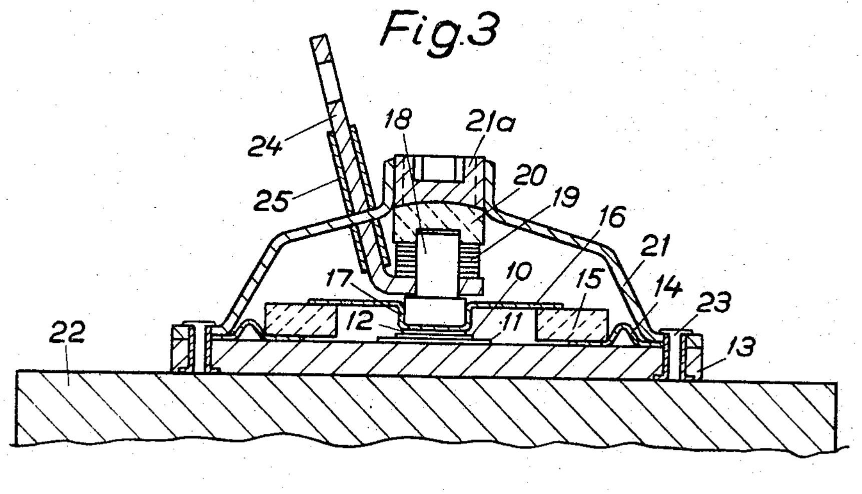
Figure 4:
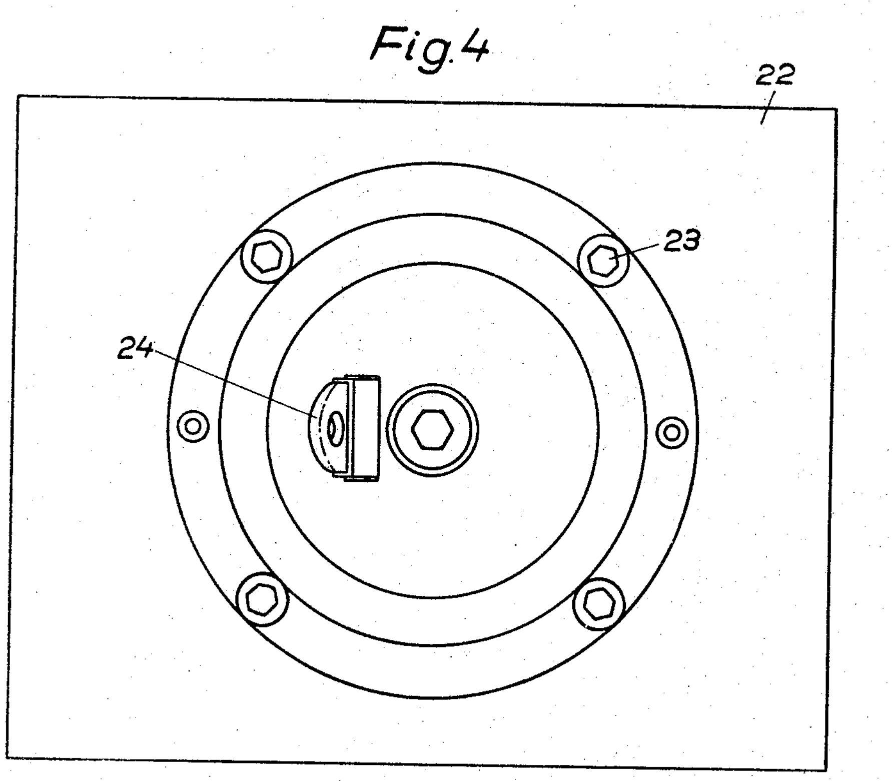

In the arrangement according to FIGS. 3 and 4, in which the designations from FIGS. 1 and 2 are the same for the corresponding parts in the two arrangements, the pressure contact between the semiconductor system and the counter electrode is effected after the cap 21 has been fixed to the cooling body 22. This is done by means of the clamping screw **21*a*, which forms a part of the cap 21**.

It is obvious that the base member 13 and the cap 21 can each be fixed to the cooling body with screwed joints, for example with the joint of the cap outside that of the base member and not with the joints, as shown in the figures. It is also obvious that the base-member can be made as a part of the cooling body, i.e., the parts 13 and 22 can consist of a single coherent body, so that the base member not only serves as a base for the semiconductor system, but also as cooling body.

The intermediate part of insulating material, which in the arrangements shown in the figures consists of a single ring of ceramic material or porcelain, can in accordance with the invention consist of for example two or several similar rings or other parts arranged one above the other. Particularly if the semiconductor device is a thyristor or transistor, it can be suitable to shape the intermediate part in this way for then the necessary connections for a gate electrode in a thyristor or for a conductor to the base in a transistor can be arranged in a ring-like way between two rings of the type shown in the figures, arranged one above the other. Even in the case that the intermediate insulating part in accordance with the figures only consists of one ring, the necessary connections can be arranged in holes arranged for this purpose in the intermediate part, if the semiconductor consists of a thyristor or a transistor.

We claim:

1. A semiconductor device capable of carrying high currents comprising an element comprising a semiconductor wafer, said element having two major opposed surfaces and a casing, said casing comprising a metal base member engaging one of said major opposed surfaces and a cover attached to said metal base member, said cover and metal base member hermetically enclosed the semiconductor wafer, said cover comprising a first metal part attached to the metal base member and a second part comprising a body of insulating material attached to said first metal part and a second metal part attached to the second part of insulating material and overlying said metal base member and being in engagement with the other of said major opposed surfaces, said metal base member being in direct contact with a cooling body, a closed metal cap having an opening therein and overlying said cover and electrically insulated from said second metal part, said cap having a peripheral portion attached to said metal base member, a counter-electrode extending between said cap and said second metal part, a body of insulating material beneath the cap electrically insulating the second metal part from the closed cap, spring means located between said cap and said second metal part for pressing said counter-electrode into pressurized engagement with said second metal part, and a connection conductor attached to said counter-electrode and extending through said opening to the outside of said cap and being separated from said cap at said opening by insulating material.

2. A semiconductor device as claimed in claim 1, a screw threaded in said cap, said body of insulating material beneath the cap being positioned between said screw and said spring means.

References Cited

UNITED STATES PATENTS

| | | | |
|---|---|---|---|
| 3,313,987 | 4/1967 | Boyer | 317—234 |
| 2,756,374 | 7/1956 | Colleran et al. | 317—234 |
| 3,222,579 | 12/1965 | Fitzgibbon et al. | 317—234 |

JOHN W. HUCKERT, *Primary Examiner.*

A. M. LESNIAK, *Assistant Examiner.*